US008988565B2

(12) United States Patent
Asano et al.

(10) Patent No.: US 8,988,565 B2
(45) Date of Patent: Mar. 24, 2015

(54) IMAGING APPARATUS

(71) Applicant: FUJIFILM Corporation, Tokyo (JP)

(72) Inventors: Hideki Asano, Kanagawa-ken (JP);
Takeharu Tani, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/076,827

(22) Filed: Nov. 11, 2013

(65) Prior Publication Data
US 2014/0071316 A1 Mar. 13, 2014

Related U.S. Application Data

(63) Continuation of application No. PCT/JP2012/062721, filed on May 11, 2012.

(30) Foreign Application Priority Data

May 13, 2011 (JP) ................. 2011-107759

(51) Int. Cl.
| H04N 9/083 | (2006.01) |
| H04N 5/335 | (2011.01) |
| G02B 5/20 | (2006.01) |
| G02B 13/00 | (2006.01) |
| H01L 27/146 | (2006.01) |
| H04N 5/225 | (2006.01) |

(52) U.S. Cl.
CPC ............... *H04N 5/335* (2013.01); *G02B 5/201* (2013.01); *G02B 13/001* (2013.01); *H01L 27/14621* (2013.01); *H01L 27/14627* (2013.01); *H04N 5/2257* (2013.01); *H01L 27/14618* (2013.01)
USPC ........................................................ 348/270

(58) Field of Classification Search
USPC ........................................................ 348/270
See application file for complete search history.

(56) References Cited

U.S. PATENT DOCUMENTS

| 7,295,386 | B2 | 11/2007 | Taniyama |
| 7,535,658 | B2 | 5/2009 | Taniyama |
| 7,602,560 | B2 | 10/2009 | Kawaski |

(Continued)

FOREIGN PATENT DOCUMENTS

| JP | 2007-122007 A | 5/2007 |
| JP | 2009-111225 A | 5/2009 |

(Continued)

OTHER PUBLICATIONS

International Search Report; PCT/JP2012/062721; Aug. 7, 2012.

(Continued)

*Primary Examiner* — Usman Khan
(74) *Attorney, Agent, or Firm* — Studebaker & Brackett PC

(57) ABSTRACT

An imaging apparatus, including imaging optical system having a lens group and an aperture stop, and a solid-state image sensor which includes a photoelectric conversion layer made of an organic material and a color filter layer with color filters of two or more colors and a separation wall. The photoelectric conversion layer has a thickness of 0.1 82 m to 1 μm, each of the color filters has a refractive index of 1.5 to 1.8, the separation wall has a width of 0.05 μm to 0.2 μm and a refractive index of 1.22 to 1.34, and the lens group and the solid-state image sensor are disposed such that the relationship between a pixel pitch D (μm) of the sensor and a maximum angle α (°) of a principal ray incident on the sensor is 45≥α≥25.D−20 where D≤2.6 μm.

3 Claims, 5 Drawing Sheets

(56) References Cited

U.S. PATENT DOCUMENTS

| | | |
|---|---|---|
| 7,633,690 B2 | 12/2009 | Yasuhiko |
| 7,715,119 B2 | 5/2010 | Taniyama |
| 8,223,234 B2 | 7/2012 | Inuiya |
| 2010/0060769 A1 | 3/2010 | Inuiya |
| 2010/0245638 A1 | 9/2010 | Ota |

FOREIGN PATENT DOCUMENTS

| | | |
|---|---|---|
| JP | 2010-067827 A | 3/2010 |
| JP | 2010-074218 A | 4/2010 |
| JP | 2010-212455 A | 9/2010 |
| JP | 2010-232537 A | 10/2010 |
| JP | 2010-272654 A | 12/2010 |

OTHER PUBLICATIONS

Written Opinion of the International Searching Authority; PCT/JP2012/062721; Aug. 7, 2012.

D. Yokoyama et al.; Stack Type CMOS Image Sensor with Photoconductive Layer of Organic Semiconductor, Extended Abstrasts (The 54th Spring Meeting, 2007); The Japan Society of Applied Physics and Related Societies No. 3; Mar. 27, 2007; pp. 1318; 28p-V-1.

An Office Action; "Notification of Grounds for Rejection," issued by the Japanese Patent Office on Jun. 3, 2014, which corresponds to Japanese Patent Application No. 2011-107759 and is related to U.S. Appl. No. 14/076,827; with English language partial translation.

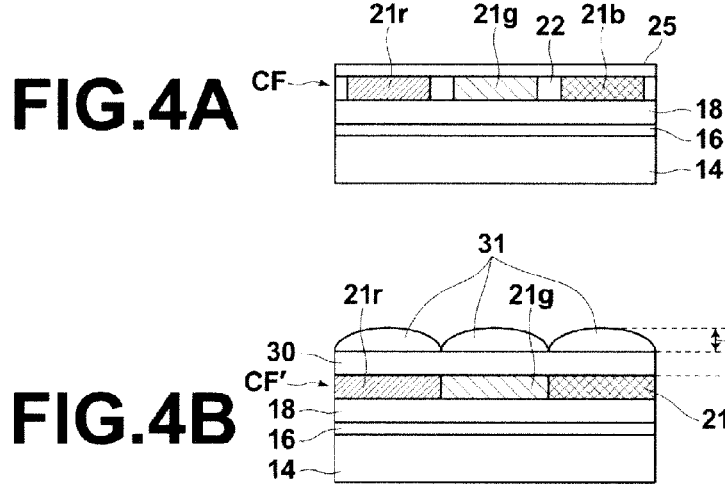
FIG. 4A
FIG. 4B
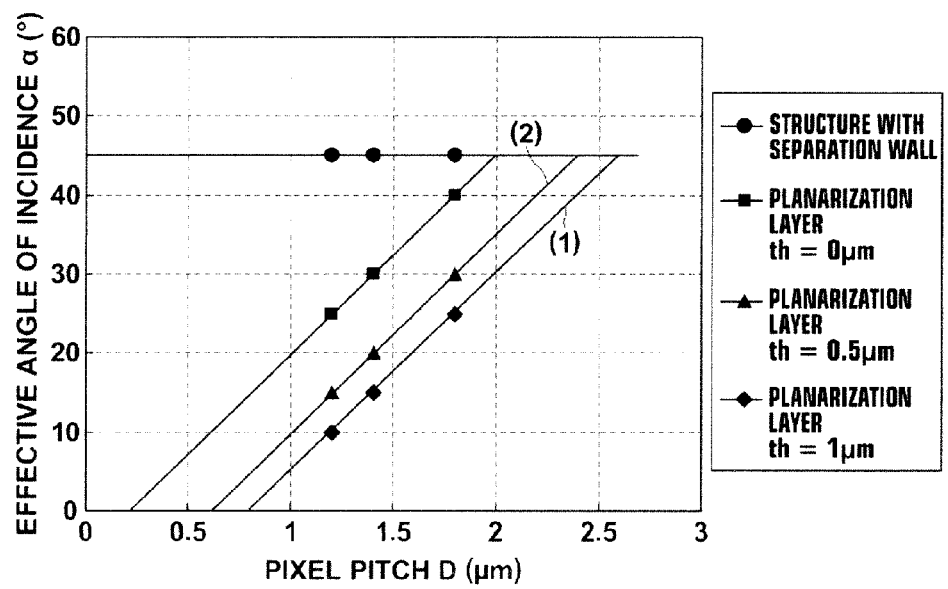
FIG. 5

IMAGING APPARATUS

TECHNICAL FIELD

The present invention relates to an imaging apparatus having a solid-state image sensor made of a photoelectric conversion film of an organic material and a color filter stacked on top of each other.

BACKGROUND ART

As imaging devices, typified by digital cameras, can be downsized easily, they are built into various types of portable devices, such as cell phones, PDAs, and the like. Further, they are widely used as cameras of videophones or vehicle cameras for monitoring images of inside and outside of various types of vehicles from the driver seat. The imaging apparatus includes an imaging unit in which an imaging optical system and a solid-state image sensor that photoelectrically converts a subject image formed by the optical system are unitized, in addition to circuits for reading out an imaging signal by driving the solid-state image sensor and obtaining digitized image data by performing various types of signal processing on the imaging signal, and a memory device for recording the image data.

For example, in the case where an imaging device is incorporated into a mobile phone or PDA widely used as personal digital assistants, it is relatively easy to reduce the thickness of the circuits and memory device by various mounting methods, but it is difficult to reduce the thickness of the imaging unit in view of the optical performance thereof.

Ordinary front illuminated CMOS image sensors, currently being used widely, include microlenses embedded in an incident surface of light from a subject in order to improve the aperture efficiency of pixels and lead beams of an image to portions of the photoelectric conversion section of the respective pixels as much as possible. This may improve the aperture efficiency in comparison with the case in which the microlenses are not provided, whereby photoelectric conversion efficiency is also improved.

As the photoelectric conversion section that photoelectrically converts a subject image is located beneath a wiring layer, some of the incident light beams are blocked by the wiring or the like, thereby causing large loss. Further, a light beam having an incident angle greater than a certain angle may leak to an adjacent pixel, as well as being blocked by the wiring or the like, and the light beam can not contribute to the photoelectric conversion of the original pixel and instead incident on the photoelectric conversion layer of the adjacent pixel. That is, larger incident angle may result in significant problems of sensitivity degradation and color mixture.

Consequently, in the front illuminated CMOS image sensor, the allowable range of spread angle of light beam is limited due to the pixel structure in which the photoelectric conversion section is located below the wiring layer as described above. In the front illuminated CMOS image sensor, it is said that the photoelectric conversion efficiency on the pixel basis is highest when light beams are incident on the imaging surface at right angle, which is reduced sharply from 100% at right-angle incident to about 35% at an incident angle of about 20 degrees and to about 5% of the right-angle incident when the incident angle exceeds about 30 degrees due to blockage of most of the light beams by the wiring layer and the like or leakage to an adjacent pixel. Under the circumstances described above, an optical system used for an imaging device is designed such that the incident angle of the principal ray incident on a peripheral portion of the image screen may fall in about 30 degrees or less as described, for example, in Japanese Unexamined Patent Publication No. 2007-122007, U.S. Pat. Nos. 7,633,690, and 7,602,560. In order to reduce the incident angle as described above, it is necessary to lengthen the overall optical length of the imaging lens (lens group) to some extent, and this is an obstacle to the reduction in overall thickness of the imaging device.

Recently, a significant reduction in pixel pitch has been made and results of experimental production of image sensors with a pixel pitch of less than 1 µm are started to be reported. The reduction in pixel area results in larger sensitivity degradation, so that improvement in photoelectric conversion efficiency has been made and currently a so-called back illuminated type is predominant in order to reduce the loss of incident light due to the wiring in the front illuminated image sensor. In the back illuminated system, the photoelectric conversion section is disposed on the light incident side, which is advantageous for improving the photoelectric conversion efficiency. In the back illuminated system, the cross-talk between adjacent pixels is also a big problem in which large incident angle of incident light causes significant color mixture.

As such, use of organic materials is proposed for the photoelectric conversion layer instead of the conventional silicon as described, for example, in U.S. Pat. No. 8,223,234 and U.S. Patent Application Publication No. 20100245638. As organic materials have a larger visible light absorption coefficient in comparison with silicon, the thickness of the photoelectric conversion layer may be reduced in comparison with the silicon photoelectric conversion layer and the reduction in the thickness may reduce the cross-talk between pixels. Whereas a photoelectric conversion layer made of the conventional silicon requires a thickness of about 3 µm, the thickness of a photoelectric conversion layer made of an organic material may be reduced to as thin as about 0.5 µm. The reduction in thickness of the photoelectric conversion layer may result in a thinner image sensor.

Further, U.S. Patent Application Publication No. 20100245638 proposes an image sensor in which the distance between color filters provided above the photoelectric conversion section and the photoelectric conversion section is 3 µm or less and a separation wall is provided between adjacent color filters. The color filters provided with separation walls allow cross-talk between adjacent pixels to be reduced largely.

DISCLOSURE OF INVENTION

U.S. Patent Application Publication No. 20100245638 allows reduction in thickness of the image sensor but sufficient consideration is not given to the imaging device to which the image sensor is incorporated. That is, sufficient consideration is not given to the relationship between the image sensor and imaging optical system in an imaging device, pixel pitch, light incident angle, and the like for realizing an imaging device having favorable optical properties with a reduced thickness.

The present invention has been developed in view of the circumstances described above and it is an object of the present invention to provide an imaging apparatus having a solid-state image sensor in which thickness reduction and downsizing are achieved, as well as favorable optical properties.

An imaging apparatus of the present invention is an apparatus, including:

an imaging optical system having a lens group and an aperture stop; and a solid-state image sensor for taking an image formed on an imaging surface of the imaging optical system, wherein the solid-state image sensor is a sensor having a plurality of pixels on a substrate and includes a photoelectric conversion layer made of an organic material and a color filter layer disposed above the photoelectric conversion layer with color filters of two or more colors and a transparent separation wall separating each of the color filters of the respective colors, wherein:

the photoelectric conversion layer has a thickness of 0.1 μm to 1 μm;

each of the color filters of the respective colors has a refractive index of 1.5 to 1.8;

the separation wall has a width of 0.05 μm to 0.2 μm; the separation wall has a refractive index of 1.22 to 1.34; and the lens group and the solid-state image sensor are disposed such that the relationship between a pixel pitch D (μm) of the solid-state image sensor and a maximum angle α (°) of a principal ray incident on the solid-state image sensor is 45≥α≥25.D−20 when D≤2.6 μm.

Preferably, the relationship between the pixel pitch D (μm) and the maximum angle α (°) of the principal ray is 45≥α≥25.D−15 when D≤2.4 μm.

Further preferably, the relationship between the pixel pitch D (μm) and the maximum angle α (°) of the principal ray is 45≥α≥25.D−5 when D≤2.0 μm.

The imaging apparatus of the present invention includes a solid-state image sensor having a photoelectric conversion layer made of an organic material, and the thickness of the photoelectric conversion layer may be reduced to 0.1 μm to 1 μm. Further, the imaging apparatus includes a color filter layer having a separation wall separating each of color filters of respect colors. As each of the color filters has a refractive index of 1.5 to 1.8 and the separation wall has a refractive index of 1.22 to 1.34, the cross-talk between adjacent pixels may be reduced significantly. Further, in the case where the pixel pitch ID is not greater than 2.6 μm and a maximum incident angle of a principal ray is taken as α (°), the lens group and image sensor are disposed such that the relationship of α≥25.D−20 is satisfied and, therefore, values of a in the range defined above may be used so that the overall optical length of the lens group may be reduced and reduction in thickness of the apparatus may be realized. In the case where an image sensor having conventional color filters, without separation walls, and microlenses is employed, incident angles in the range of α≥25.D−20 are unable to be used due to significant color mixture. According to the present invention that uses incident angles in the aforementioned range, the overall length of the lens group may reliably be reduced in comparison with the case in which an image sensor having conventional color filters, without separation walls, and microlenses is used. Consequently, the present invention may provide a thin imaging apparatus.

In the imaging apparatus of the present invention, the relationship between the pixel pitch of the image sensor and maximum incident angle a is clearly defined, which is not clear in U.S. Patent Application Publication No. 20100245638, so that the imaging apparatus of the present invention may have satisfactory optical properties. Further, the present invention clearly reveals that the incident angles up to 45° are acceptable, thereby providing high design flexibility.

BRIEF DESCRIPTION OF DRAWINGS

FIG. 4A is a cross-sectional view of an image sensor having color filters with separation walls used in simulation, illustrating the structure thereof.

FIG. 4B is a cross-sectional view of an image sensor having microlenses used in simulation, illustrating the structure thereof (Comparative Example).

FIG. 5 is a graph illustrating the relationship between pixel pitch and effective incident angle generated based on simulation results.

BEST MODE FOR CARRYING OUT THE INVENTION

Figure 1A:
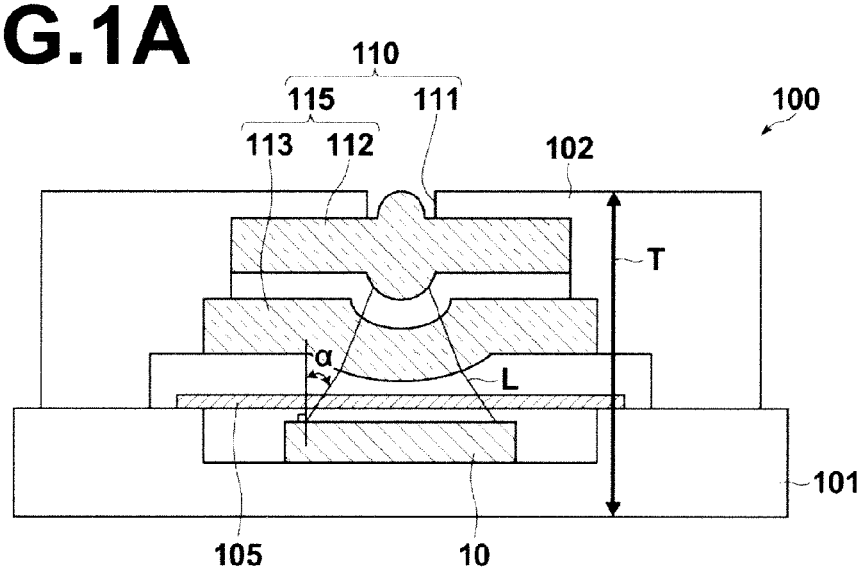
FIG. 1A is a schematic cross-sectional view of an imaging apparatus according to an embodiment of the present invention, illustrating the structure thereof.

An imaging apparatus according to an embodiment of the present invention will now be described. FIG. 1A is a schematic cross-sectional view of an imaging apparatus according to an embodiment of the present invention, illustrating a structure thereof, and FIG. 1B is a schematic partial cross-sectional view of a solid-state image sensor provided in the imaging apparatus.

As illustrated in FIG. 1A, the imaging apparatus 100 includes a solid-state image sensor 10 incorporated in a ceramic package 101, and lenses 112, 113 fixedly disposed in a lens holder 102 having an aperture stop 111 so as to form an image on a surface (light receiving surface) of the solid-state image sensor 10, in which the ceramic package 101 and lens holder 102 are combined. An infrared light cut filter 105 is provided between a lens group of the lenses 112, 113 and solid-state image sensor 10. Here, an imaging optical system 110 is formed by the aperture stop 111 and lens group 115.

Figure 1B:
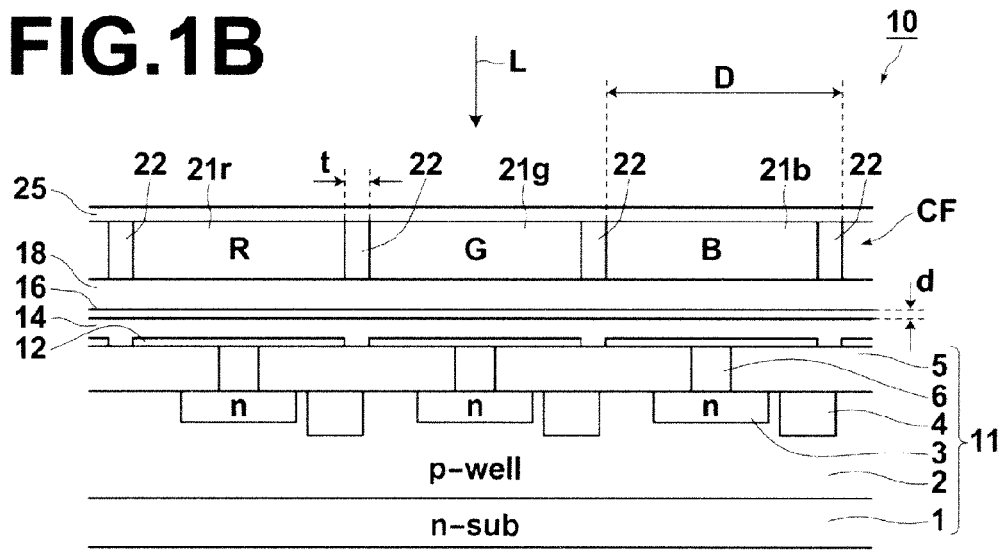
FIG. 1B is a schematic cross-sectional view of a solid-state image sensor provided in the imaging apparatus according to the embodiment of the present invention, illustrating the structure thereof.

As illustrated in FIG. 1B, the solid-state image sensor 10 includes a semiconductor circuit board 11, a plurality of pixel electrodes (back contact electrodes) 12 formed in two-dimensional arrays on the semiconductor circuit board 11, a photoelectric conversion layer 14 of an organic material continuously formed on the plurality of pixel electrodes 12, and a common electrode (upper electrode) 16 formed on the photoelectric conversion layer 14 as a single layer which is an opposite electrode opposing to the plurality of pixel electrodes. Further, a transparent insulation layer 18 is stacked on the upper electrode 16 and a color filter layer CF which includes two or more (three in the present embodiment) color filters 21r, 21g, 21b and separation walls 22 is provided on the insulation layer 18. Still further, a low reflective layer 25 is provided on the color filter layer CF.

The imaging apparatus 100 is configured such that light L passed through the aperture stop 111 is sequentially transmitted through the lens 112, lens 113, and infrared light cut filter 105 to form an image on the light receiving surface of the solid-state image sensor 10. Here, the lens group 115 and solid-state image sensor 10 are arranged such that the maximum incident angle a of the principal ray transmitted through the lens 113 does not exceed 45°.

In addition, the positional relationship between the lens group 115 and solid-state image sensor 10 is set such that the relationship between the pixel pitch D (μm) and the maximum angle $\alpha$ (°) of the principal ray becomes $45 \geq \alpha \geq 25.D-20$, when $D \leq 2.6$ μm.

Preferably, the positional relationship between the lens group 115 and solid-state image sensor 10 is set such that the relationship between the pixel pitch D (μm) and the maximum angle $\alpha$ (°) of the principal ray becomes $45 \geq \alpha \geq 25.D-15$, when $D \leq 2.4$ μm. It is also preferable that the positional relationship between the lens group 115 and solid-state image sensor 10 is set such that the relationship between the pixel pitch D (μm) and the maximum angle $\alpha$ (°) of the principal ray becomes $45 \geq \alpha \geq 25.D-5$, when $D \leq 2.0$ μm.

Figure 2:
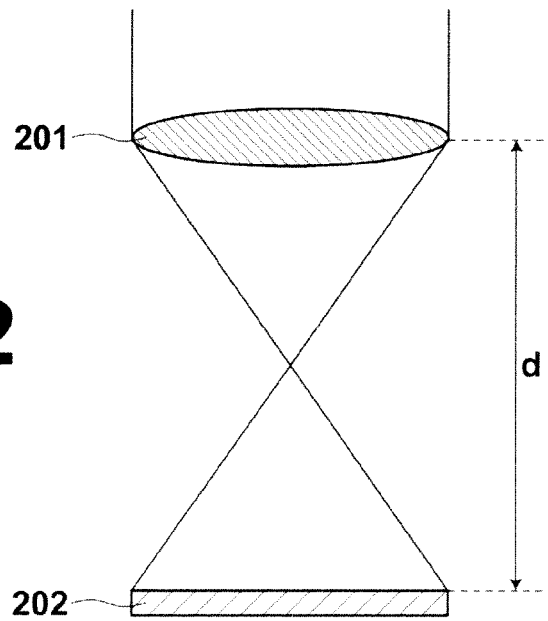
FIG. 2 illustrates an advantageous effect of the present invention.

Here, advantageous effects of the present invention are verified with a simple optical system. FIG. 2 illustrates the case in which light is focused by one lens 201 to form an image on an image sensor 202 at the same magnification. In the case where full HD imaging is performed with a pixel pitch of 2.0 μm, the size of the image sensor is calculated as 2.0 μm×1920=3.84 mm in horizontal direction and 2.0 μm×1080=2.16 mm in vertical direction. This requires a diagonal length of 4.4 mm. If the aperture is assumed to be the same as the image sensor of 4.4 mmφ, and if the image sensor is a sensor that uses color filters with a separation wall of the present invention (FIG. 4A), the use of a lens with NA=0.7 allows the distance "d" between the lens and image sensor to be made 4.4 mm, while the color filters with microlenses (FIG. 4B) allow the use of a lens with NA up to 0.5, so that the distance between the lens and image sensor becomes 7.6 mm. The actual optical system has a different aperture depending on the product, two or more lenses are used in order to reduce the influence of aberration and distortion on the periphery, and a complicated aspherical lens is used, so that the structure of the actual optical system is not that simple as described above. But, in principle, identical advantageous effects may be obtained and the length in the optical axis direction may be reduced.

Hereinafter, each component will be described in detail.

(Semiconductor Circuit Board)

The semiconductor circuit board 11 includes an n-type silicon substrate (hereinafter, simply referred to as substrate 1) on which a p-type well region 2 is provided and a plurality of n-type impurity diffusion regions 3 is formed. The impurity diffusion regions 3 are formed in two dimensional arrays in correspondence with the pixel electrodes 12 formed on the circuit board 11. Further, a signal readout section 4 is provided adjacent to each impurity diffusion region 3 near the surface of the well region 2 to output a signal according to charges stored in each impurity diffusion region 3.

The signal readout section 4 is a circuit that converts charges stored in the impurity diffusion region 3 to a voltage signal and outputs the voltage signal, which may be configured, for example, by the known CCD or CMOS circuit.

Further, an insulation layer 5 is formed on the surface of the well region 2 of the substrate 1. A plurality of pixel electrodes, each having substantially a rectangular shape in plan view, is arranged on the insulation layer 5 at a predetermined interval. Each pixel electrode 12 is electrically connected to each corresponding impurity diffusion region 3 of substrate 1 via a connection section 6 of a conductive material formed so as to penetrate through the insulation layer 5.

A bias voltage is applied between the back contact electrodes 12 and upper electrode 16 of the image sensor 10 from a voltage supply (not shown) such that, for example, holes of charges (holes and electrons) generated in the photoelectric conversion layer 14 when light is incident on the photoelectric conversion layer 14 are moved to the upper electrode 16 and electrons to back contact electrodes 12. In this case, the upper electrode 16 is used as a hole collection electrode and the back contact electrodes 12 are used as an electron collection electrode.

The upper electrode 16 and back contact electrodes 12 are selected in view of adhesion to the photoelectric conversion layer 14, electron affinity, ionization potential, stability, and the like.

The upper electrode 16 and back contact electrodes 12 are formed by various methods depending on the material used. In the case of ITO, for example, electron beam method, sputtering method, resistance heating vapor deposition method, chemical reaction method (sol-gel method or the like), application method of dispersion of tin-doped indium oxide, or the like is used to form a film. In the case of ITO, UV ozone process, plasma treatment, or the like may be used.

As it is necessary to cause light to incident on the photoelectric conversion layer 14, the upper electrode 16 is made of a transparent conductive material. Preferably, the transparent electrode material has a light transmittance of about 80% or more in the visible light range of wavelength from about 420 nm to about 660 nm.

Specific materials for the upper electrode 16 may include, for example, conductive metal oxides, such as tin oxide, zinc oxide, indium oxide, tin-doped indium oxide (ITO), and the like, metals, such as gold, silver, chrome, nickel, and the like, mixtures or layered bodies of these metals and conductive metal oxides, inorganic conductive materials, such as copper iodide, copper sulfide, and the like, organic conductive materials, such as polyaniline, polythiophene, polypyrrole, and the like, silicon compounds, and layered bodies of these and ITO. Among them, the conductive metal oxides are preferably used, and ITO, $Z_nO$, and $I_nO$ are particularly preferable in view of the productivity, high conductivity, transparency, and the like.

The material of the back contact electrodes 12 may be any conductive material and is not necessarily transparent. In the case where it is necessary to cause light to transmit to the side of substrate 1, however, the back contact electrodes 12 also need to be made of a transparent electrode material. In this case, ITO is preferably used as the transparent electrode material of the back contact electrodes 12 as in the upper electrode 16.

(Photoelectric Conversion Layer)

The photoelectric conversion layer 14 made of an organic material is formed in a film with a thickness in the range from 0.1 μm to 1.0 μm. A thinner layer thickness is more effective for preventing color mixture, but there exists a trade-off between the layer thickness and light absorption, and the actual optimum layer thickness may be about 0.5 μm.

Materials used for the photoelectric conversion layer 14 may include, for example, various kinds of organic semiconductor materials, such as those used as photosensitive materials of electrophotography. Among them, a material having a quinacridone skeleton or an organic material having a phthalocyanine skeleton is particularly preferable in view of high photoelectric conversion performance, excellent color separation capability in spectral separation, high durability against prolonged light exposure, ease of vacuum deposition, and the like.

Preferably, the organic material of the photoelectric conversion layer 14 includes at least one of p-type organic semiconductor and n-type organic semiconductor. As the p-type organic semiconductor and n-type organic semiconductor, for example, either one of quinacridone derivative, naphthalene derivative, anthracene derivative, phenanthrene derivative, tetracene derivative, pyrene derivative, perylene derivative, and fluoranthene derivative is particularly preferred.

Formation of the photoelectric conversion layer 14 with an organic material may result in a higher light absorption coefficient in comparison with the case in which photodiodes formed on a silicon substrate are used as the photoelectric conversion section. Thus, light incident on the photoelectric conversion layer 14 is more likely to be absorbed. According to this nature, light obliquely incident on the photoelectric conversion layer 14 is not likely to leak to an adjacent pixel section and is photoelectrically converted in the pixel section where the light is incident, whereby improvement in transmission efficiency and prevention of cross-talk may be achieved.

(Insulation Layer)

The insulation layer 18 may be made of $Al_2O_3$, $SiO_2$, SiN, or a mixed film of these.

(Color Filter Layer)

Figure 3:
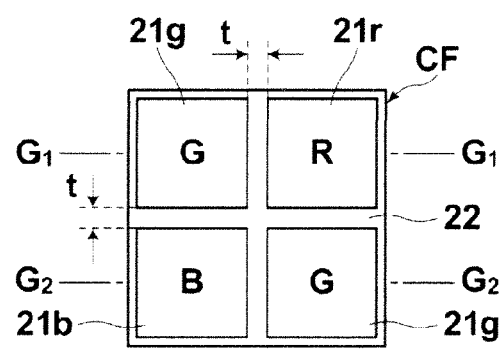
FIG. 3 is a diagram illustrating a layout of color filters.

As illustrated in FIG. 3, the color filter layer CF includes a plurality of color filters that transmits light of different wavelengths from each other. Here, the color filter layer CF includes color filters 21r, 21g, and 21b made of an organic material that includes red/blue/green pigments or dyes provided with respect to each pixel with a separation wall 22 made of a transparent material having a refractive index smaller than that of the color filter material between each of color filters 21r, 21g, and 21b.

The color filters 21r, 21g, and 21b transmit light of different wavelengths from each other, in which color filter 21r functions as an R light color filter configured to transmit red wavelength light of the incident light. Likewise, the color filter 21g functions as a G light color filter configured to transmit green wavelength light of the incident light and the color filter 21b functions as a B light color filter configured to transmit blue wavelength light of the incident light.

The plurality of color filters 21r, 21g, and 21b is arranged in a color pattern, such as Bayer arrangement, according to the arrangement of the pixel sections and either one of them is included in each pixel section. FIG. 3 illustrates, by way of example, a Bayer arrangement of color filters 21r, 21g, and 21b at four pixel sections. The arrangement of the plurality of color filters 21r, 21g, and 21b is not limited to that described above and may be changed arbitrarily.

The refractive index of each color filter differs depending on the color of red, blue, and green, as well as the wavelength of incident light, but each of the color filters 21r, 21g, and 21b has a refractive index in the range from 1.5 to 1.8 with respect to incident wavelengths (at least wavelengths of the visible light range (400 nm to 700 mm)).

The thickness of each of the color filters 21r, 21g, and 21b is in the range from 0.3 µm to 1.0 µm.

The separation wall 22 for separating the color filters 21r, 21g, and 21b is formed substantially in a grid pattern in the plan view of FIG. 3 to individually enclose each of them.

The width "t" of the separation wall 22 corresponding to the distance between each of the color filters 21r, 21g, and 21b is in the range from 0.05 µm to 0.2 µm with the refractive index in the range from 1.22 to 1.34. A lower refractive index may result in higher characteristics as the image sensor but the use of a material having an extremely low refractive index cause a problem of vulnerability as a film. Consequently, a material with a refractive index of about 1.28 to 1.30 is preferably used.

(Low Reflective Layer)

The low reflective layer 25 is provided in order to reduce reflection loss when light is directly incident on the color filter CF from the air. When the refractive index of the material of the color filter CF (average value of refractive indices of three colors) is taken as nc, a material having a refractive index of $\sqrt{nc}$ may be selected with a layer thickness corresponding to ¼ of 550 nm which is the approximate center wavelength of the visible light. For example, in the case of the present image sensor, a material having a refractive index around 1.28 may be used as the refractive index of the color filter CF is 1.5 to 1.8 with a thickness of 550/4/1.28=107 nm≈0.1 µm.

The imaging apparatus of the present embodiment is configured in the manner described above.

The image sensor 10 in the present embodiment is a layered image sensor in which the photoelectric conversion layer 14 is layered on the substrate 1. In comparison with a conventional front illuminated image sensor in which charge transfer paths are formed on a substrate on which photodiodes are formed and a color filter layer is formed on the charge transfer paths with a planarization film therebetween, the present image sensor may reduce the distance "d" between the color filter layer and photoelectric conversion layer 14. More specifically, the distance "d" is a distance from the lower surface of the color filter layer CF and the upper surface of the photoelectric conversion layer 14. According to the configuration of the present image sensor, the distance "d" may be reduced to not greater than 3 µm.

The use of the image sensor 10 having the aforementioned structure allows the thickness "T" of the imaging apparatus 100 to be made smaller than ever before. More specifically, in the case where the solid-state image sensor is ¼ inches (6.35 mm), the thickness "T" of the conventional apparatus is about 5 mm or greater, while the aforementioned configuration may achieve a thickness of less than 4 mm.

(Simulation)

Results of an optical simulation performed for the case in which the color filter CF having the separation wall 22 according to the present invention is provided and the case in which a color filter CF' having microlenses 31 without a separation wall is provided, as a comparative example.

Schematic cross-sectional views of the structures of image sensors for which the simulation is performed are shown in FIGS. 4A and 4B respectively. FIG. 4A illustrates the structure of the image sensor having color filters with a separation wall and FIG. 4B illustrates the structure of the image sensor having color filters with microlenses. In the present simulation, color filters 21r, 21g, and 21b are arranged in the Bayer arrangement shown in FIG. 3 in both cases, and incident angle dependence of the light amount incident through a green filter at a green pixel area and the incident light amount from an adjacent pixel (red or blue) is calculated. More specifically, the incident angle dependence is calculated when the incident angle is varied in a direction of $G_1$-$G_1$ line in the color filter CF shown in FIG. 3, taking the incident light amount of a G pixel adjacent to the R pixel on the $G_1$-$G_1$ line as $G_1$ and incident light amount from the R pixel adjacent to the G pixel as R. Likewise, the incident angle dependence is calculated when the incident angle is varied in a direction of $G_2$-$G_2$ line, taking the incident light amount of a G pixel adjacent to the B pixel on the $G_2$-$G_2$ line as $G_2$ and incident light amount from the B pixel adjacent to the G pixel as B.

Each structure uses an organic material for the photoelectric conversion layer 14 with a thickness of 0.5 μm and includes a 0.3 μm thick insulation layer 18 transparent to visible light between the color filter layer CF or CF' and photoelectric conversion layer 14.

The width of the separation wall 22 of the color filter CF is taken as 0.2 μm and the refractive index thereof is taken as 1.3. The film thicknesses of the color filters 21r, 21g, and 21b are taken as 0.7 μm, 0.5 μm, and 0.5 μm respectively.

The film thicknesses of the color filters 21r, 21g, and 21b of the color filter layer CF' are taken as 0.7 μm, 0.5 μm, and 0.5 μm respectively. A structure in which planarization layer 30 is provided between the color filter CF' and microlenses 31 is assumed, and the thickness of the planarization layer is defined as the thickness between the red color filter and microlens 31. Further, the lens thickness "tm" of the microlenses is taken as 0.6 μm.

Normally, the thickness of the planarization layer is 1 to 2 μm, but calculations were made for three different structures in which the planarization layer has thicknesses of 0 μm, 0.5 μm, and 1.0 μm respectively in the present simulation. The planarization layer 30 is a layer required for stably forming the microlenses due to the fact that the surface of the color filter layer CF' becomes uneven in a currently common manufacturing process and color filters of different colors have different thicknesses. Although the general thickness of the planarization layer is rather thick ranging from 1 to 2 μm, technological advancement is expected in materials used for the planarization layer and the planarization may be achieved with a planarization layer having a thickness less than 1 μm in the future. As the microlenses need to be provided on a planar surface, a planarization layer of 0 μm is inconceivable in practice and a thickness of about 0.5 μm, at best, may be the film thickness limit (minimum film thickness).

The relationship between the pixel pitch and effective incident angle in which color mixture is allowable obtained by the simulation is shown in FIG. 5. The effective angle of incidence is defined as an angle when light amount is reduced by 10% from that at normal incidence.

With respect to each of the structure having the color filter CF with the separation wall shown in FIG. 4A and the structure having the color filter CF' with microlenses shown in FIG. 4B, a simulation was performed for each of the cases in which the planarization layer is varied to 1 μm, 0.5 μm, and 0 μm and pixel pitch is varied to 1.8, 1.4, and 1.2 μm.

The results of the present simulation shown in FIG. 5 indicate that color mixture is unavoidable at a large incident angle of light as the pixel pitch is reduced even for a thin photoelectric conversion layer of an organic material in the conventional color filter structure with microlenses, whereby the maximum effective incident angle becomes small. In contrast, it is known that the color filter structure with the separation wall may drastically reduce the color mixture due to oblique incident of light and the allowable range of the maximum effective incident angle is increased significantly.

Figure 6:
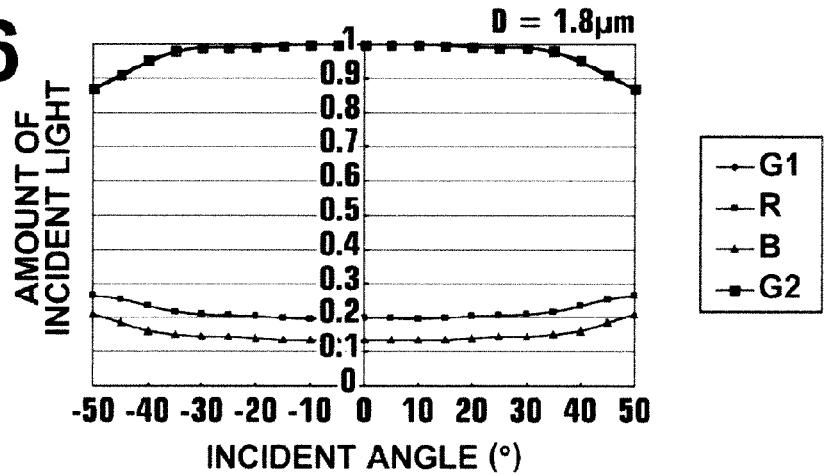
FIG. 6 is a graph illustrating simulation results of incident angle and amount of incident light in the green pixel of the structure shown in FIG. 4A (pixel pitch of 1.8 μm).
Figure 7:
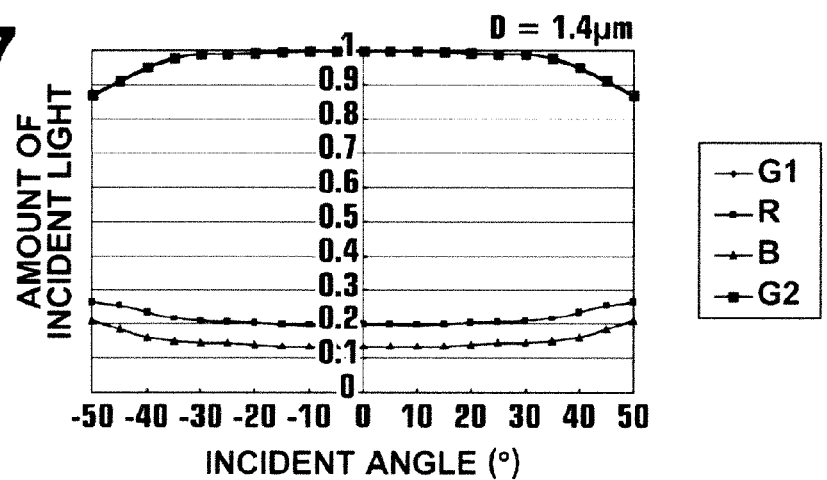
FIG. 7 is a graph illustrating simulation results of incident angle and amount of incident light in the blue pixel of the structure shown in FIG. 4A (pixel pitch of 1.4 μm).
Figure 8:
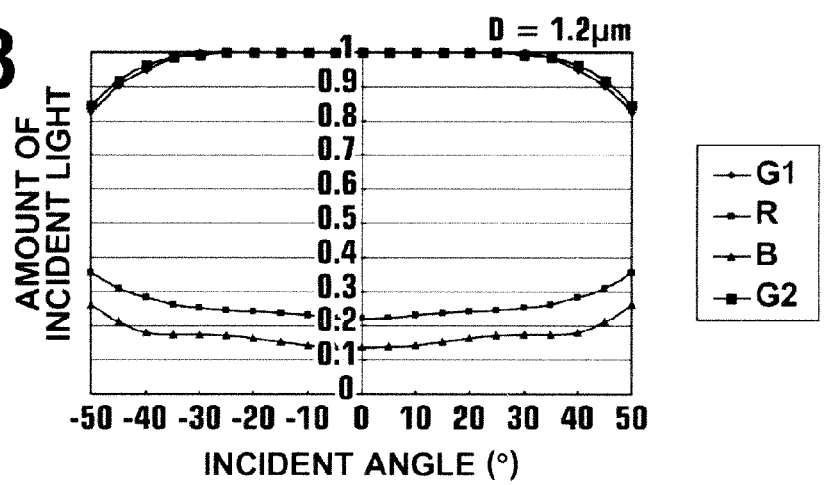
FIG. 8 is a graph illustrating simulation results of incident angle and amount of incident light in the blue pixel of the structure shown in FIG. 4A (pixel pitch of 1.2 μm).

FIGS. 6 to 8 show simulation results of the color filter structure with the separation wall shown in FIG. 4A in the cases where the pixel pitch is taken as 1.8, 1.4, and 1.2 respectively.

As shown in FIGS. 6 to 8, it is known that substantially no degradation is seen up to an incident angle of 45° regardless of whether the pixel pitch is 1.8, 1.4, or 1.2 in the imaging apparatus of the present invention.

Figure 9:
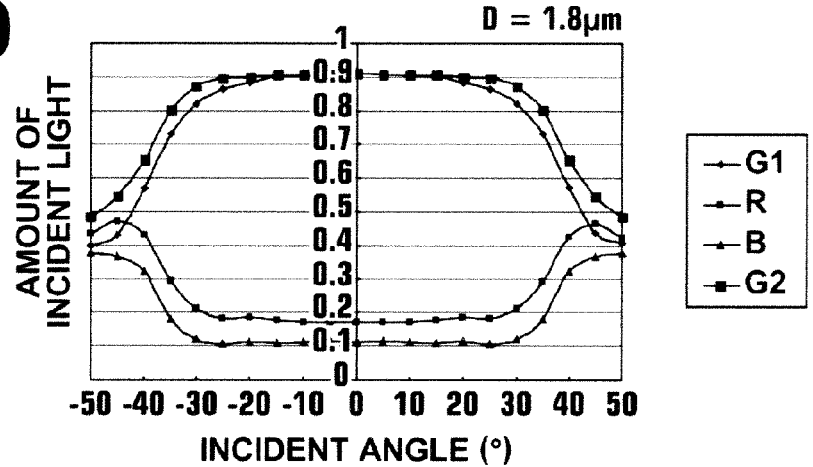
FIG. 9 is a graph illustrating simulation results of incident angle and amount of incident light in the green pixel of the structure shown in FIG. 4B (pixel pitch of 1.8 μm).
Figure 10:
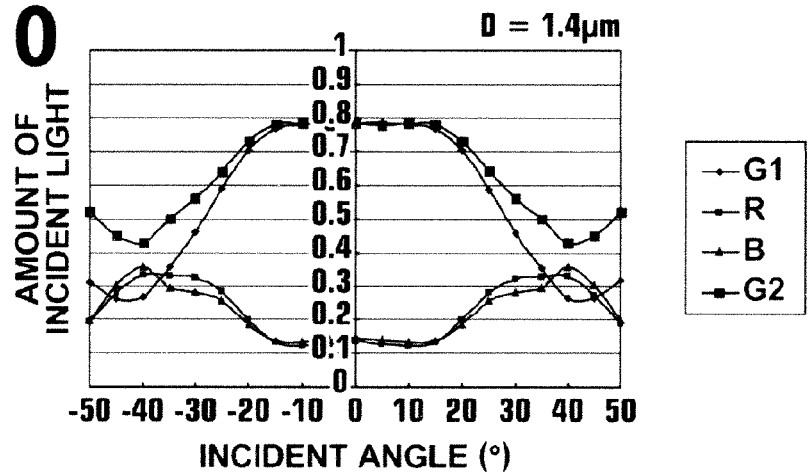
FIG. 10 is a graph illustrating simulation results of incident angle and amount of incident light in the green pixel of the structure shown in FIG. 4B (pixel pitch of 1.4 μm).
Figure 11:
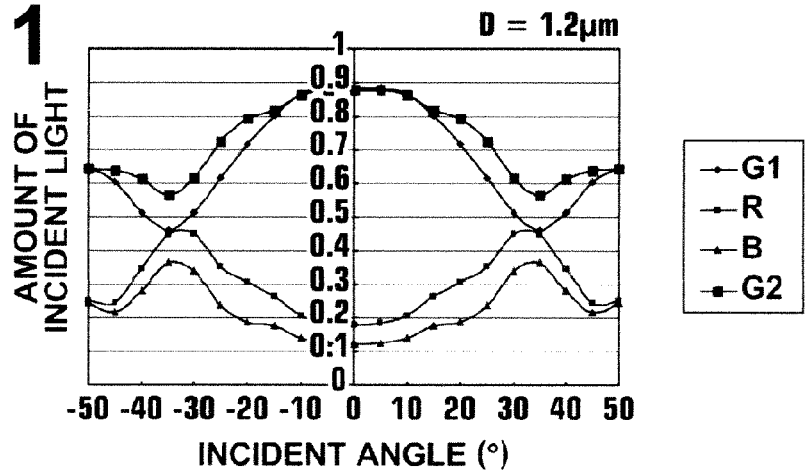
FIG. 11 is a graph illustrating simulation results of incident angle and amount of incident light in the green pixel of the structure shown in FIG. 4B (pixel pitch of 1.2 μm).

FIGS. 9 to 11 show simulation results of the structure in which color filter with microlenses shown in FIG. 4B (without the separation wall) is provided and the average thickness of the planarization layer $t_h$ is taken as 0.5 μm in the cases where the pixel pitch is taken as 1.8, 1.4, and 1.2 respectively.

As shown in FIGS. 9 to 11, in the image sensor having color filters with microlenses and the planarization layer with a thickness of 0.5 μm, degradation occurs in the amount of incident light and color mixture when the incident angle exceeds 30° in the case where the pixel pitch D is 1.8 μm (FIG. 9). Likewise, it is seen that significant degradation occurs in the amount of incident light and color mixture when the incident angle exceeds 20° in the case where the pixel pitch D is 1.4 μm (FIG. 10) and significant degradation occurs in the amount of incident light and color mixture when the incident angle exceeds 15° in the case where the pixel pitch D is 1.2 μm (FIG. 11).

Note that the vertical axes (incident light amount) of the graphs of simulation results in FIGS. 6 to 11 are those normalized with the light amount of $G_1$ at normal incidence (incident angle of) 0° shown in FIG. 6 being taken as 1.

As shown in FIG. 5, in the structure having the color filters with microlenses, color mixture from an adjacent pixel becomes problematic when the incident angle exceeds 25° at the pixel pitch D of 1.8 μm in the case where the planarization layer has a realistic value of 1.0 μm. Likewise, performance degradation due to color mixture occurs when the incident angle exceeds 15° at the pixel pitch D of 1.4 μm and when the incident angle exceeds 10° at the pixel pitch D of 1.2 μm. That is, the effective incident angle is reduced as the pixel pitch is reduced. In other words, in the structure having the color filters with microlenses, satisfactory performance may be obtained under the conditions below the straight line (1) in FIG. 5 in the case where the thickness of the planarization layer is 1.0 μm. In the case where the pixel pitch is taken as D (μm) and effective incident angle as α (°), the straight line (1) in FIG. 5 shows α=25.D−20, and reduction in the incident light amount of G light and performance degradation due to color mixture of R light, B light and the like occur in the range α≥25.D−20.

In the case of the structure having color filters with microlenses in which the planarization layer has a thickness of 0.5 μm, which is expected to be realized in the future through technological advancement in the material or the like, good performance may be obtained under the conditions below the straight line (2) in FIG. 5. In this case, performance degradation occurs in the range 60 ≥25.D−15.

Further, in the case of the structure having color filters with microlenses in which the planarization layer has a thickness of 0 μm, which is the theoretical limitation of manufacturing, color mixture from an adjacent pixel becomes problematic when the incident angle exceeds 40° at the pixel pitch D of 1.8 μm. Likewise, performance degradation due to color mixture occurs when the incident angle exceeds 30° at the pixel pitch D of 1.4 μm and when the incident angle exceeds 22.5° at the pixel pitch D of 1.2 μm. In this case, it has become clear that performance degradation occurs in the range In contrast, it has become clear for the first time by the simulation that the color filters with a separation wall has a small degradation with respect to the incident angle regardless of the pixel pitch and color mixture problem does not occur until the incident angle exceeds 45° at any of pixel pitches 1.8 μm, 1.4 μm, and 1.2 μm. In the case of the conventional color filters with microlenses, it can be said that color mixture is not problematic in the pixel pitch of 2 μm or greater, which may also depend on the thickness of the planarization layer to a certain extent through, in view of the fact that the smaller the pixel pitch the smaller the maximum incident angle. Conversely, on the small pixel pitch side, it may be effective until a pixel pitch of 0.4 μm obtained by dividing the wavelength size, i.e., a red wavelength of 0.7 μm, the longest wavelength, by the refractive index of the color filters, although calculations were made only to 1.2 μm in the simulation. On the smaller pixel pitch side than 0.4 μm, it is expected that color mixture may occur even at normal incidence since the pixel size becomes smaller than the amplitude of light. The above studies have revealed that the color filters with a separation wall are particularly effective in the pixel pitch range from about 0.4 μm to about 2 μm.

Based on the simulation results, the present invention defines the range of the pixel pitch and effective angle of incidence which has been unable to be achieved by the conventional structure. That is, the present invention defines the incident angle range that can be achieved by an image sensor having color filters with a separation wall, in which the maximum incident angle is greater than or equal to an incident angle at which large loss occurs in the color filters with microlenses, in the following manner.

$45 \geq \alpha \geq 25 \cdot D - 20$ when pixel pitch is not greater than 2.6 μm,
$45 \geq \alpha \geq 25 \cdot D - 15$ when pixel pitch is not greater than 2.4 μm, and
$45 \geq \alpha \geq 25 \cdot D - 5$ when pixel pitch is not greater than 2.0 μm.

As noted above, in the case of the color filters with microlenses, it is unrealistic not to use the planarization layer 30, i.e., using a planarization layer having a thickness of 0 μm. In order to employ a structure without the planarization layer 30, the color filter layer needs to be patterned such that filters of the respective colors have the same thickness with flattened surfaces and without any overlapping portion between adjacent pixels. In fact, it is technically difficult to provide the color filters of the respective colors so as to have the same thickness as the respective color filters have different light absorption coefficients, and color filters of the respective colors used in commercially available imaging apparatuses, in general, have different thicknesses. Further, it is also difficult to flatten the surface of each filter and, in actuality, has a convex shape with a rounded edge portion. Consequently, the surface of the red, blue, and green color filters becomes an uneven surface formed of each filter surface having a convex shape. As microlenses need to be formed on a planar surface, the planarization layer 30 for planarizing the uneven surface of the color filters is essential. The difference in height of the uneven pattern on the surface of the color filters inevitably remains at least 0.2 to 0.3 μm no matter how hard try to reduce it, and a thickness of at least three times the difference is required for planarizing the surface by applying a resin. Thus, the practical planarization layer requires a thickness of about 1 μm.

In the structure having color filters with microlenses, the effective light incident angle becomes small as the pixel pitch is reduced. Thus, it is necessary to lengthen the overall length of the optical system and this has been an obstacle to the downsizing of the apparatus. In the solid-state image sensor of the present invention, substantially no color mixture problem occurs for obliquely incident light until the incident angle exceeds 45°. Thus, an imaging apparatus employing the present image sensor may be used in combination with any optical system having a less than or equal to 45° and may accept an effective angle of incidence greater than that deemed to be the upper limit with respect to each pixel pitch in the conventional image sensor with microlenses. This allows the overall length of the module to be reduced and is advantageous for downsizing and thickness reduction. As such, the imaging apparatus of the present invention may be effectively used as a built-in imaging apparatus in various applications such as digital cameras, other home electric appliances, and portable digital assistants.

The imaging apparatus of the present invention may also be applied to surveillance cameras that need to perform super-wide angle imaging, digital cameras, video cameras, and cell phones requiring an ultra-slim configuration, and the like.

What is claimed is:

1. An imaging apparatus, comprising:
   an imaging optical system having a lens group and an aperture stop; and
   a solid-state image sensor for taking an image formed on an imaging surface of the imaging optical system, wherein the solid-state image sensor is a sensor having a plurality of pixels on a substrate and includes a photoelectric conversion layer made of an organic material and a color filter layer disposed above the photoelectric conversion layer with color filters of two or more colors and a transparent separation wall separating each of the color filters of the respective colors, wherein:
   the photoelectric conversion layer has a thickness of 0.1 μm to 1 μm;
   each of the color filters of the respective colors has a refractive index of 1.5 to 1.8;
   the separation wall has a width of 0.05 μm to 0.2 μm;
   the separation wall has a refractive index of 1.22 to 1.34; and
   the lens group and the solid-state image sensor are disposed such that the relationship between a pixel pitch D (μm) of the solid-state image sensor and a maximum angle α (°) of a principal ray incident on the solid-state image sensor is
   $45 \geq \alpha \geq 25 \cdot D - 20$ when $D \leq 2.6$ μm.

2. The imaging apparatus of claim 1, wherein the relationship between the pixel pitch D (μm) and the maximum angle α (°) of the principal ray is
   $45 \geq \alpha \geq 25 \cdot D - 15$ when $D \leq 2.4$ μm.

3. The imaging apparatus of claim 1, wherein the relationship between the pixel pitch D (μm) and the maximum angle α (°) of the principal ray is
   $45 \geq \alpha \geq 25 \cdot D - 5$ when $D \leq 2.0$ μm.

* * * * *